United States Patent
Hirata (10) Patent No.: US 9,812,408 B2
(45) Date of Patent: Nov. 7, 2017

(54) SEMICONDUCTOR DEVICE WITH ELECTROSTATIC DISCHARGE PROTECTION DEVICE NEAR THE EDGE OF THE CHIP

(75) Inventor: Shigeru Hirata, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 733 days.

(21) Appl. No.: 11/173,615

(22) Filed: Jul. 1, 2005

(65) Prior Publication Data

US 2006/0001101 A1    Jan. 5, 2006

(30) Foreign Application Priority Data

Jul. 2, 2004    (JP) ................................. 2004-196864
Jun. 27, 2005    (JP) ................................. 2005-185872

(51) Int. Cl.
   *H01L 23/62*    (2006.01)
   *H01L 23/58*    (2006.01)
   *H01L 27/02*    (2006.01)
   *H01L 23/00*    (2006.01)

(52) U.S. Cl.
   CPC ............ *H01L 23/585* (2013.01); *H01L 24/06* (2013.01); *H01L 27/0251* (2013.01); *H01L 27/0292* (2013.01); *H01L 2224/05554* (2013.01); *H01L 2924/12036* (2013.01); *H01L 2924/1306* (2013.01); *H01L 2924/13091* (2013.01); *H01L 2924/14* (2013.01); *H01L 2924/3011* (2013.01)

(58) Field of Classification Search
   CPC .................................................. H01L 27/0292

USPC .................................................. 257/355, 546
See application file for complete search history.

(56) References Cited

U.S. PATENT DOCUMENTS

| | | | | |
|---|---|---|---|---|
| 5,670,799 A | * | 9/1997 | Croft ............................ | 257/173 |
| 5,789,783 A | * | 8/1998 | Choudhury et al. .......... | 257/355 |
| 5,811,874 A | * | 9/1998 | Lee ............................... | 257/666 |
| 5,898,193 A | | 4/1999 | Ham | |
| 6,157,065 A | * | 12/2000 | Huang et al. ................. | 257/355 |
| 6,411,485 B1 | | 6/2002 | Chen et al. | |
| 6,479,869 B1 | * | 11/2002 | Hiraga .......................... | 257/350 |
| 2003/0193071 A1 | | 10/2003 | Huang et al. | |
| 2004/0056355 A1 | * | 3/2004 | Minami et al. ............... | 257/758 |
| 2004/0188841 A1 | * | 9/2004 | Chen et al. .................... | 257/758 |

FOREIGN PATENT DOCUMENTS

| | | |
|---|---|---|
| JP | 06-350082 | 12/1994 |
| JP | 09-129738 | 5/1997 |
| JP | 09-199670 | 7/1997 |
| JP | 2003-31669 | 1/2003 |
| JP | 2004-056087 | 2/2004 |

\* cited by examiner

*Primary Examiner* — Hsin-Yi Hsieh
(74) *Attorney, Agent, or Firm* — Fish & Richardson P.C.

(57) ABSTRACT

A semiconductor device has a supply pad to which a supply voltage is fed, a supply conductor that is electrically connected to the supply pad, an input/output pad via which a signal is fed in from outside or fed out to outside, an electrostatic protection device that is electrically connected to the input/output pad and that is electrically connected via the supply conductor to the supply pad, and an internal circuit that is electrically connected via a signal conductor to the input/output pad. The electrostatic protection device, the input/output pad, and the internal circuit are arranged in this order from edge to center of the semiconductor device.

6 Claims, 8 Drawing Sheets

SEMICONDUCTOR DEVICE WITH ELECTROSTATIC DISCHARGE PROTECTION DEVICE NEAR THE EDGE OF THE CHIP

This application is based on Japanese Patent Application No. 2004-196864 filed on Jul. 2, 2004 and Japanese Patent Application No. 2005-185872 filed on Jun. 27, 2005, the contents of which are hereby incorporated by reference.

BACKGROUND OF THE INVENTION

1. Field of the Invention

The present invention relates to a semiconductor device such as a semiconductor integrated circuit (hereinafter "IC") chip, and more particularly to a semiconductor device furnished with an electrostatic breakdown protection capability.

2. Description of Related Art

An IC chip or the like is packaged with its input terminals, output terminals, and the like exposed to outside. If an overvoltage that has been conducted via a bonding wire and a bump is further conducted via a bonding pad (hereinafter "pad") to an internal circuit, the internal circuit may suffer electrostatic breakdown. To prevent this, usually, an electrostatic protection device is provided between the pad and the internal circuit.

Figure 5:
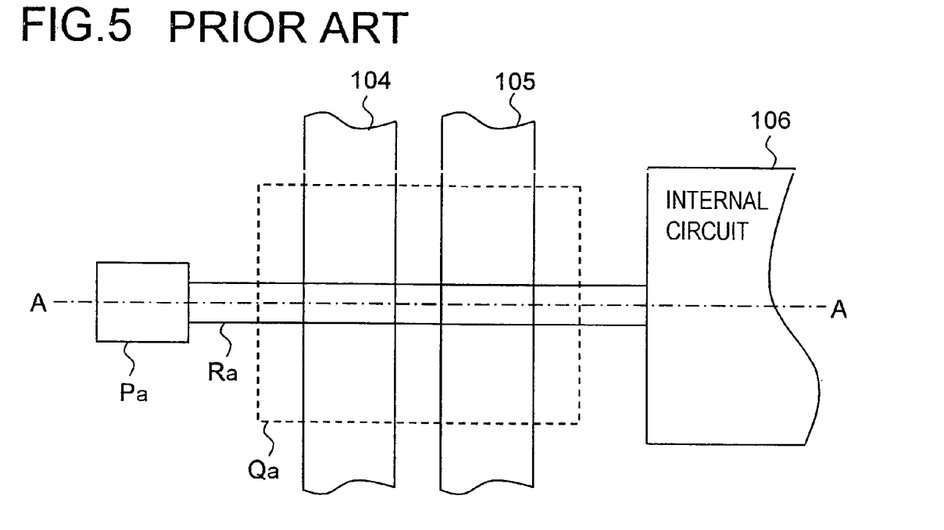
FIG. 5 is a plan view showing part of a conventional IC chip.

FIG. 5 is a plan view showing an example of an electrostatic protection circuit in a conventional IC chip. In FIG. 5 are shown: an input/output pad Pa via which a signal is fed in from outside or fed out to outside; an internal circuit 106; an electrostatic protection device Qa; a signal conductor Ra that connects together the input/output pad Pa and the internal circuit 106; a negative-side supply conductor 104, which is connected to a negative-side supply pad (unillustrated) to which a negative-side supply voltage (the ground voltage, equal to 0 V) is supplied; and a positive-side supply conductor 105, which is connected to a positive-side supply pad (unillustrated) to which a positive-side supply voltage Vcc (for example, 5 V) is supplied.

Figure 6:
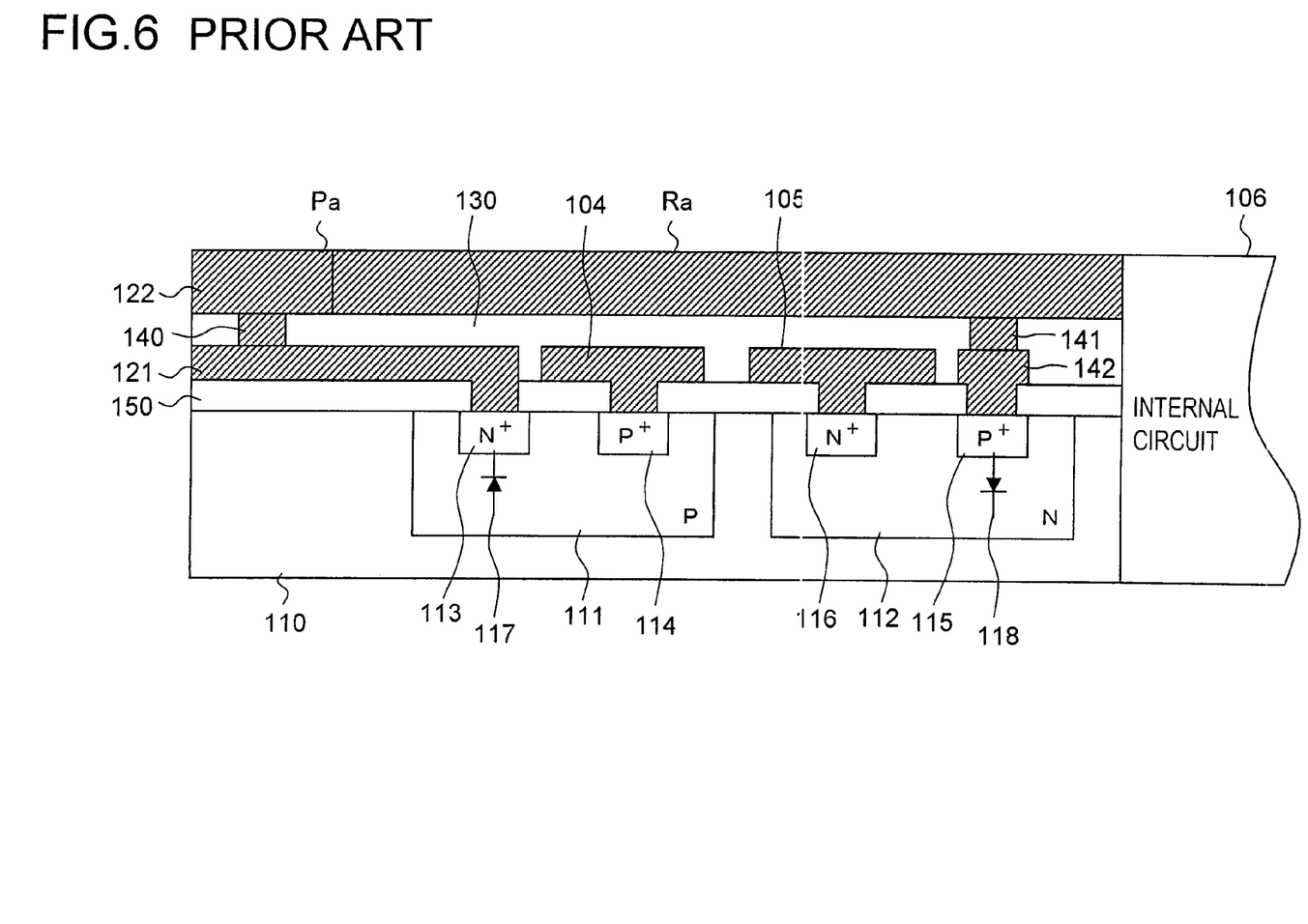
FIG. 6 is a sectional view taken along line A-A shown in FIG. 5.

FIG. 6 is a schematic sectional view taken along line A-A shown in FIG. 5. In FIG. 6, metal conductive parts are indicated by hatching. As shown in FIG. 6, this IC chip has a multiple-conductor-layer structure including the following two metal conductor layers: a first metal conductor layer (hereinafter also simply "the first layer") laid as the lower layer; and a second metal conductor layer (hereinafter also simply "the second layer") laid as the upper layer. The input/output pad Pa is composed of a metal film 121 formed in the first layer and a metal film 122 formed in the second layer. The metal films 121 and 122 are connected together at least via a contact hole 140 formed in an insulating film 130 laid between the first and second layers. The signal conductor Ra is connected, at one end, to the metal film 122 and, at the other end, to the internal circuit 106.

Through ion injection and diffusion, in an upper portion of a silicon substrate 110, a P-type well 111 and an N-type well 112 are formed; in an upper portion of the P-type well 111, an N-type diffusion layer 113 and a P-type diffusion layer 114 are formed; and, in an upper portion of the N-type well 112, a P-type diffusion layer 115 and an N-type diffusion layer 116 are formed. The PN junction between the N-type diffusion layer 113 and the P-type well 111 forms a protection diode 117, and the PN junction between the P-type diffusion layer 115 and the N-type well 112 forms a protection diode 118. These protection diodes 117 and 118 together form the electrostatic protection device Qa.

On the silicon substrate 110 having the P-type well 111 etc. mentioned above formed therein, an insulating film 150 of silicon oxide is formed, while leaving electrically connected together: the N-type diffusion layer 113 and the metal film 121; the P-type diffusion layer 114 and the negative-side supply conductor 104; the N-type diffusion layer 116 and the positive-side supply conductor 105; and the P-type diffusion layer 115 and a metal film 142. The metal film 142 is electrically connected to the signal conductor Ra via a contact hole 141.

The metal film 121, the negative-side supply conductor 104, the positive-side supply conductor 105, and the metal film 142 are formed in the first layer; the metal film 122 and the signal conductor Ra are formed in the second layer. Typically, the second layer is thicker than the first layer, and thus the following relationship holds: (the sheet resistance of the second layer)<(the sheet resistance of the first layer). Incidentally, sheet resistance denotes the resistance of a conductor per given length and given width.

Figure 7:
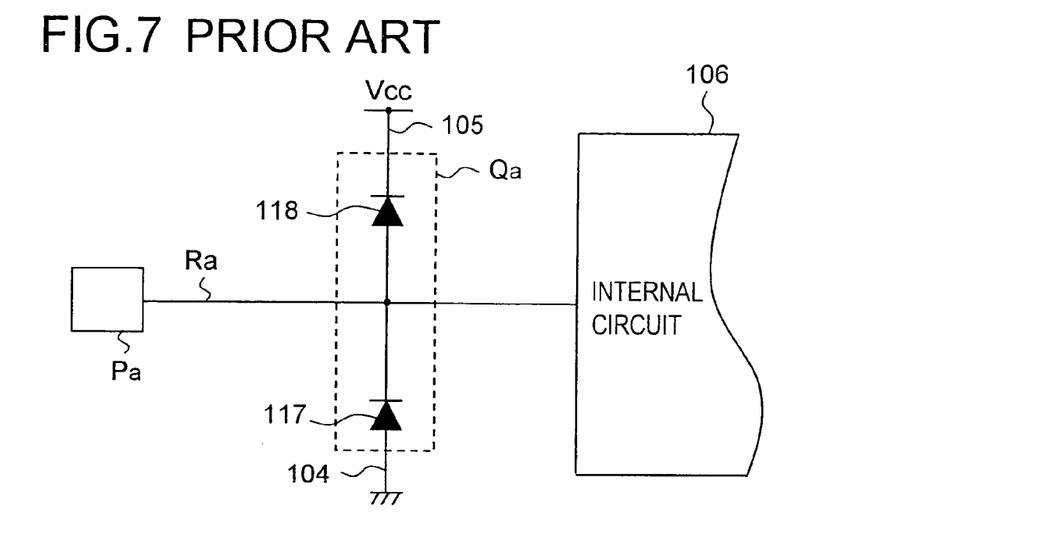
FIG. 7 shows an equivalent circuit of the structure shown in FIG. 6.

FIG. 7 shows an equivalent circuit of the structure shown in FIG. 6. When a positive overvoltage is applied via a bonding wire (unillustrated) to the input/output pad Pa, a current flows from the input/output pad Pa via the protection diode 118, the positive-side supply conductor 105, and the positive-side supply pad (unillustrated) into the Vcc supply side. On the other hand, when a negative overvoltage is applied via a bonding wire (unillustrated) to the input/output pad Pa, a current flows from ground via the negative-side supply pad (unillustrated), the negative-side supply conductor 104, and the protection diode 117 to the input/output pad Pa. In this way, the overvoltage is prevented from being applied to the internal circuit 106.

When a current flows through the protection diode 117 or 118, the voltage drop across it does not remain constant (for example, 0.7 V) irrespective of the magnitude of the current but varies due to an internal resistance and other factors. Thus, depending on the magnitude of the current, an overvoltage may reach the internal circuit 106. That is, the protection diodes 117 and 118 alone do not afford a sufficiently high level of electrostatic protection. For this reason, according to a conventionally known method, in place of or in parallel with the electrostatic protection device Qa shown in FIGS. 5 to 7, an electrostatic protection device Qb having an equivalent circuit as shown in FIG. 8 is provided.

Figure 8:
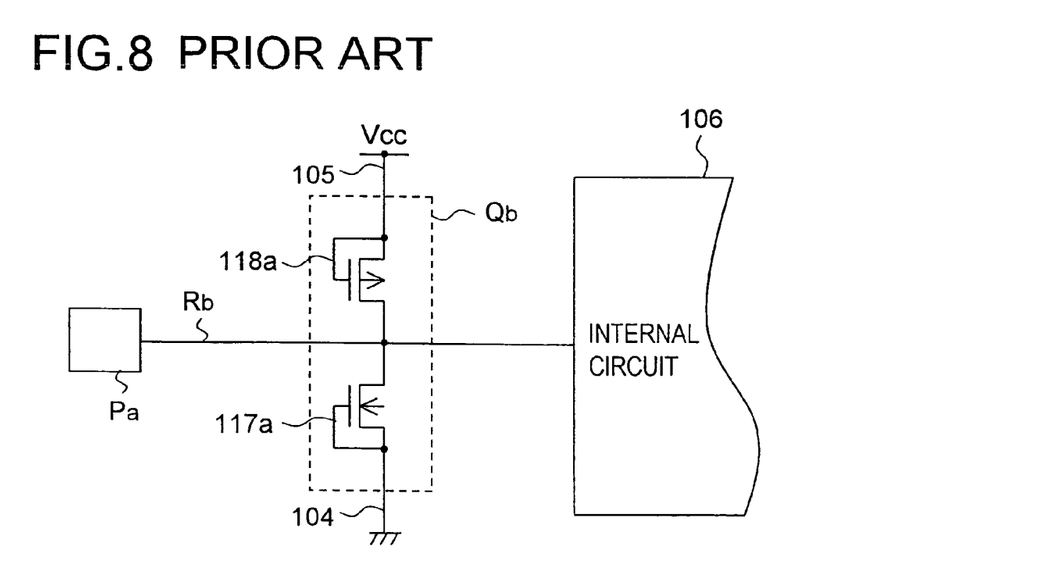
FIG. 8 shows an example of an equivalent circuit of a conventional electrostatic protection device.

As shown in FIG. 8, the electrostatic protection device Qb is composed of a P-channel (P-type semiconductor) MOS transistor (a field-effect transistor with an insulated gate) 118a and an N-channel (N-type semiconductor) MOS transistor 117a. The input/output pad Pa is connected to the source of the MOS transistor 118a and to the drain of the MOS transistor 117a, the supply voltage Vcc is fed via the positive-side supply conductor 105 to the gate and drain of the MOS transistor 118a, and the 0 V ground voltage is fed via the negative-side supply conductor 104 to the gate and source of the MOS transistor 117a. The input/output pad Pa and the internal circuit 106 are connected together via a signal conductor Rb.

In the circuit configured as described above, the snap-back characteristic resulting from the bipolar action (linear operation) of the MOS transistors 117a and 118a makes an overvoltage less likely to reach the internal circuit 106 even in the event of inflow of a large surge current. Thus, this circuit, as compared with one depending solely on the electrostatic protection device Qa composed of protection diodes, affords a higher level of protection against electrostatic breakdown.

Here is one problem. The negative-side and positive-side supply conductors 104 and 105 shown in FIG. 5 are formed by using the first layer, and are laid around the internal circuit 106, between a plurality of input/output pads (each like the input/output pad Pa) and the internal circuit 106, so as to be ultimately connected to the supply pads (unillustrated). With the recent trend for increasingly complicate circuit designs and hence increasingly larger IC chips, those supply conductors tend to be so long that their impedance (resistances) cannot be ignored.

What this means is as follows. Even when the electrostatic protection device functions in an ideal fashion, the high impedances across the supply conductors may allow an overvoltage to reach the internal circuit 106.

Here is another problem. An electrostatic protection device like the electrostatic protection device Qb designed to afford a higher level of protection against electrostatic breakdown is called an active clamper, of which many modified versions are known. Any of these, however, has a more complicate structure than the electrostatic protection device Qa composed of protection diodes. Thus, forming an active-clamper-type electrostatic protection device typically requires two (or more) metal conductor layers.

Accordingly, if an active clamper is built in an IC chip having a two-layer structure, it is impossible to lay a signal conductor Ra above the electrostatic protection device as shown in FIG. 5. Moreover, inherently intended to prevent an overvoltage applied to an input/output pad from reaching the internal circuit, an electrostatic protection device needs to be located close to the input/output pad. For these reasons, an active clamper cannot easily be built in an IC chip having a two-layer structure.

Figure 9:
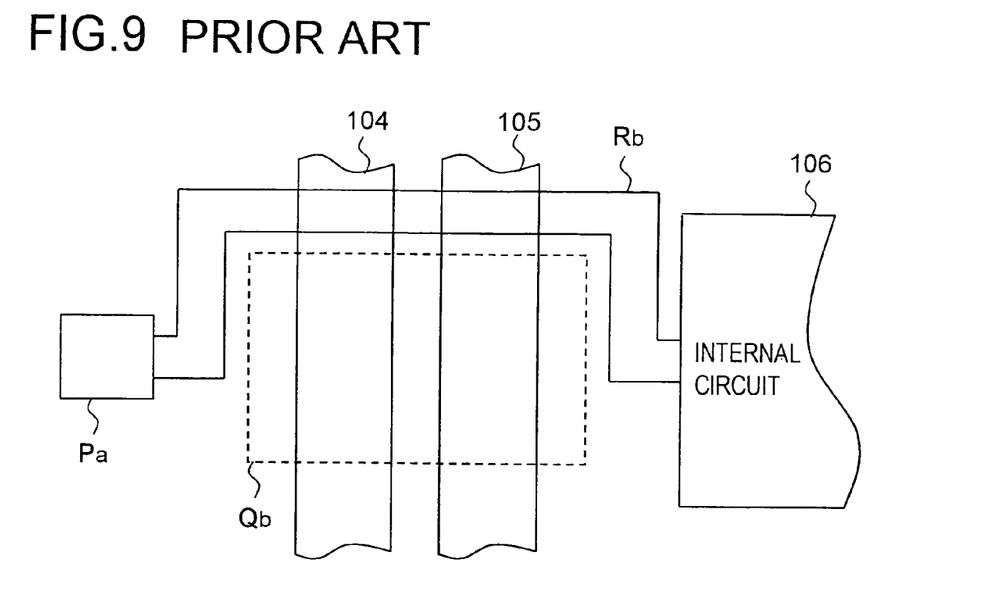
FIG. 9 is a plan view showing part of another conventional IC chip.

Even if one can, it is necessary, as shown in FIG. 9, to lay a signal conductor Rb to make a detour around the electrostatic protection device Qb so as not to overlap it, and to lay the conductors constituting the electrostatic protection device Qb so as not to short-circuit to the negative-side or positive-side supply conductor 104 or 105. Here, the signal conductor Rb is formed in the second layer, and the negative-side and positive-side supply conductors 104 and 105 are formed, as in FIG. 5, in the first layer.

Laying a single conductor to make a detour as shown in FIG. 9 increases the parasitic capacitance in the conductor, leading to a delay in the conducted signal and increased distortion in its waveform. Moreover, the part of a conductor making a detour occupies an extra area, leading to a lower degree of integration. Put the other way around, when higher priority is given to signal speed and integration degree, use of an active clamper is better avoided, although this results in a low level of protection against electrostatic breakdown (for example, as low as in the structure shown in FIGS. 5 to 7).

SUMMARY OF THE INVENTION

In view of the conventionally encountered problems discussed above, it is an object of the present invention to provide a semiconductor device that affords a higher level of protection against electrostatic breakdown without restricting the arrangement of conductors to an internal circuit, and to provide an electric appliance incorporating such a semiconductor device.

To achieve the above object, according to the present invention, a semiconductor device is provided with: a supply pad to which a supply voltage is fed; a supply conductor that is electrically connected to the supply pad; an input/output pad via which a signal is fed in from outside or fed out to outside; an electrostatic protection device that is electrically connected to the input/output pad and that is electrically connected via the supply conductor to the supply pad; and an internal circuit that is electrically connected via a signal conductor to the input/output pad. Here, the electrostatic protection device, the input/output pad, and the internal circuit are arranged in this order from edge to center of the semiconductor device.

With this structure, the electrostatic protection device is arranged closer to the edge than the input/output pad is. Thus, even in a semiconductor device having a two-layer structure, an electrostatic protection device that requires two metal conductor layers can easily be built, and thus a higher level of protection against electrostatic breakdown can easily be achieved. Moreover, the arrangement of the electrostatic protection device does not restrict in any way the arrangement of the signal conductor that connects together the input/output pad and the internal circuit. Thus, it is possible to avoid inconveniences such as an increased delay in the conducted signal and increased distortion in its waveform.

Advisably, the supply conductor is arranged nearer to the edge than the input/output pad is.

With this structure, the supply conductor can be laid without giving consideration to the arrangement of the signal conductor. Thus, the supply conductor can be formed by using, of all metal conductor layers available, the one having the smallest sheet resistance, or by using more than one of them. This helps reduce the impedance across the supply conductor, and thus helps achieve a higher level of protection against electrostatic breakdown.

Advisably, the semiconductor device is given a multiple-conductor-layer structure including n (where n is an integer greater than or equal to 2) metal conductor layers, and the supply conductor is formed by using, of those n metal conductor layers, at least one having the smallest sheet resistance.

Alternatively, the semiconductor device is given a multiple-conductor-layer structure including n (where n is an integer greater than or equal to 2) metal conductor layers, and the supply conductor is formed by using, of those n metal conductor layers, any other than the lowermost one.

Alternatively, the semiconductor device is given a multiple-conductor-layer structure including n (where n is an integer greater than or equal to 2) metal conductor layers, and the supply conductor is formed by using more than one of those n metal conductor layers.

For example, as the supply pad, there may be provided a first supply pad to which a first supply voltage is fed and a second supply pad to which a second supply voltage different from the first supply voltage is fed, and, as the supply conductor, there may be provided a first supply conductor that is electrically connected to the first supply pad and a second supply conductor that is electrically connected to the second supply pad.

Here, the first supply voltage is, for example, a negative-side supply voltage (the ground voltage, equal to 0 V), and the second supply voltage is, for example, a positive-side supply voltage (for example, 5 V). Needless to say, the voltage relationship may be reversed.

Advisably, the semiconductor device described above is incorporated in an electric appliance.

DETAILED DESCRIPTION OF PREFERRED EMBODIMENTS

Figure 1:
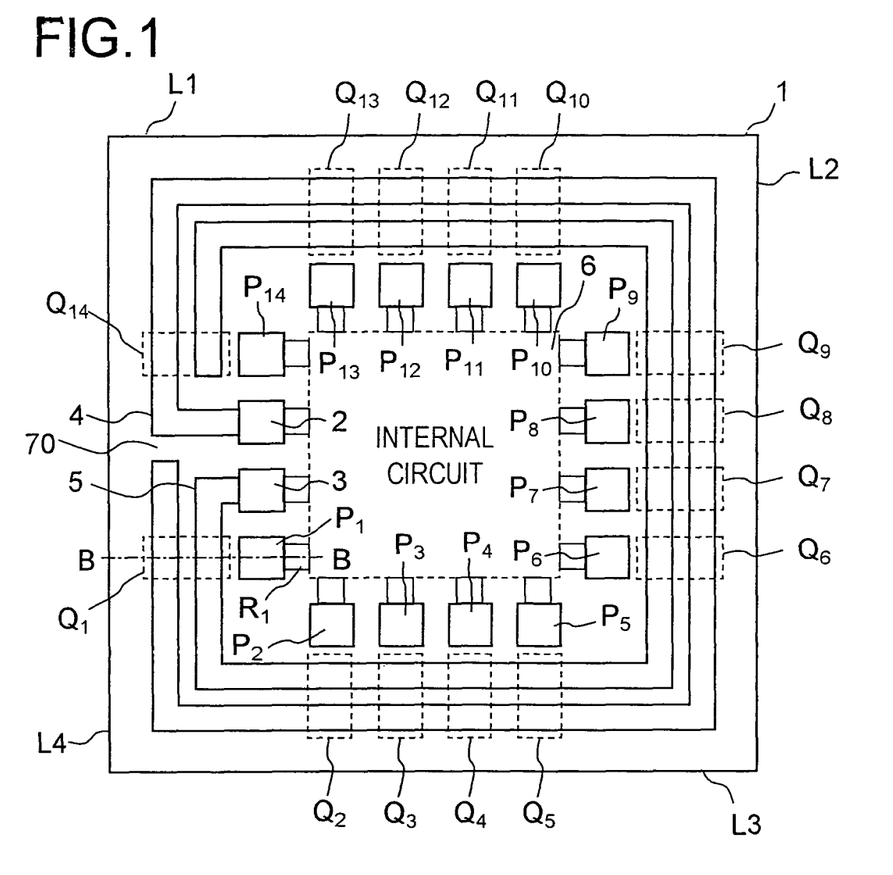
FIG. 1 is an overall plan view of an IC chip embodying the invention.

Hereinafter, semiconductor devices embodying the present invention will be described with reference to the accompanying drawings. FIG. 1 is an overall plan view of an IC chip 1 as a semiconductor device embodying the invention.

As shown in FIG. 1, the IC chip 1 is substantially square in shape. The IC chip 1 includes: a negative-side supply pad 2 to which a bonding wire or bump (unillustrated) is connected and to which a negative-side supply voltage (the ground voltage, equal to 0 V) is supplied; a positive-side supply pad 3 to which a bonding wire (unillustrated) is connected and to which a positive-side supply voltage (for example, 5 V) is supplied; a negative-side supply conductor 4 that is electrically connected to the negative-side supply pad 2 and that is arranged so as to surround the later-described input/output pads $P_1$, $P_2$, $P_3$, $P_4$, $P_5$, $P_6$, $P_7$, $P_8$, $P_9$, $P_{10}$, $P_{11}$, $P_{12}$, $P_{13}$, and $P_{14}$ and the later-described internal circuit 6; a positive-side supply conductor 5 that is electrically connected to the positive-side supply pad 3 and that is arranged so as to surround the input/output pads $P_1$, $P_2$, . . . , and $P_{14}$ and the internal circuit 6; input/output pads $P_1$, $P_2$, . . . , and $P_{14}$ to each of which a bonding wire (unillustrated) is connected and via each of which a signal is fed in from outside or fed out to outside; an internal circuit 6 that receives signals via those input/output pads which function as input pads (i.e., the input/output pads via which signals are fed in from outside) and that then outputs signals based on those input signals via those input/output pads which function as output pads (i.e., the input/output pads via which signals are fed out to outside); and electrostatic protection devices $Q_1$, $Q_2$, $Q_3$, $Q_4$, $Q_5$, $Q_6$, $Q^7$, $Q_8$, $Q^9$, $Q_{10}$, $Q_{11}$, $Q_{12}$, $Q_{13}$, and $Q_{14}$ that protect the internal circuit 6 from an overvoltage that may be applied to the input/output pads $P_1$, $P_2$, . . . , and $P_{14}$, respectively. In FIG. 1, the negative-side supply conductor 4 is cut at the site indicated as 70; it is, however, also possible to connect together, at the site 70, the part of the negative-side supply conductor 4 running from the top of the figure and the part thereof running from the bottom of the figure.

The input/output pad $P_1$ is electrically connected via a signal conductor $R_1$ to the internal circuit 6. Likewise, the input/output pads $P_2$, $P_3$, . . . , and $P_{14}$ are electrically connected respectively via signal conductors $R_2$, $R_3$, . . . , and $R_{14}$ (these reference symbols are omitted in FIG. 1) to the internal circuit 6. The supply pads 2 and 3 also are connected to the internal circuit 6 to feed it with electric power.

When the IC chip 1 is seen in a plan view as shown in FIG. 1, the direction from any of the four sides L1, L2, L3, and L4 of the IC chip 1 toward the center thereof (where the internal circuit 6 is arranged) is regarded as a direction pointing from edge to center of the IC chip 1 (i.e., from out to in).

Figure 2:
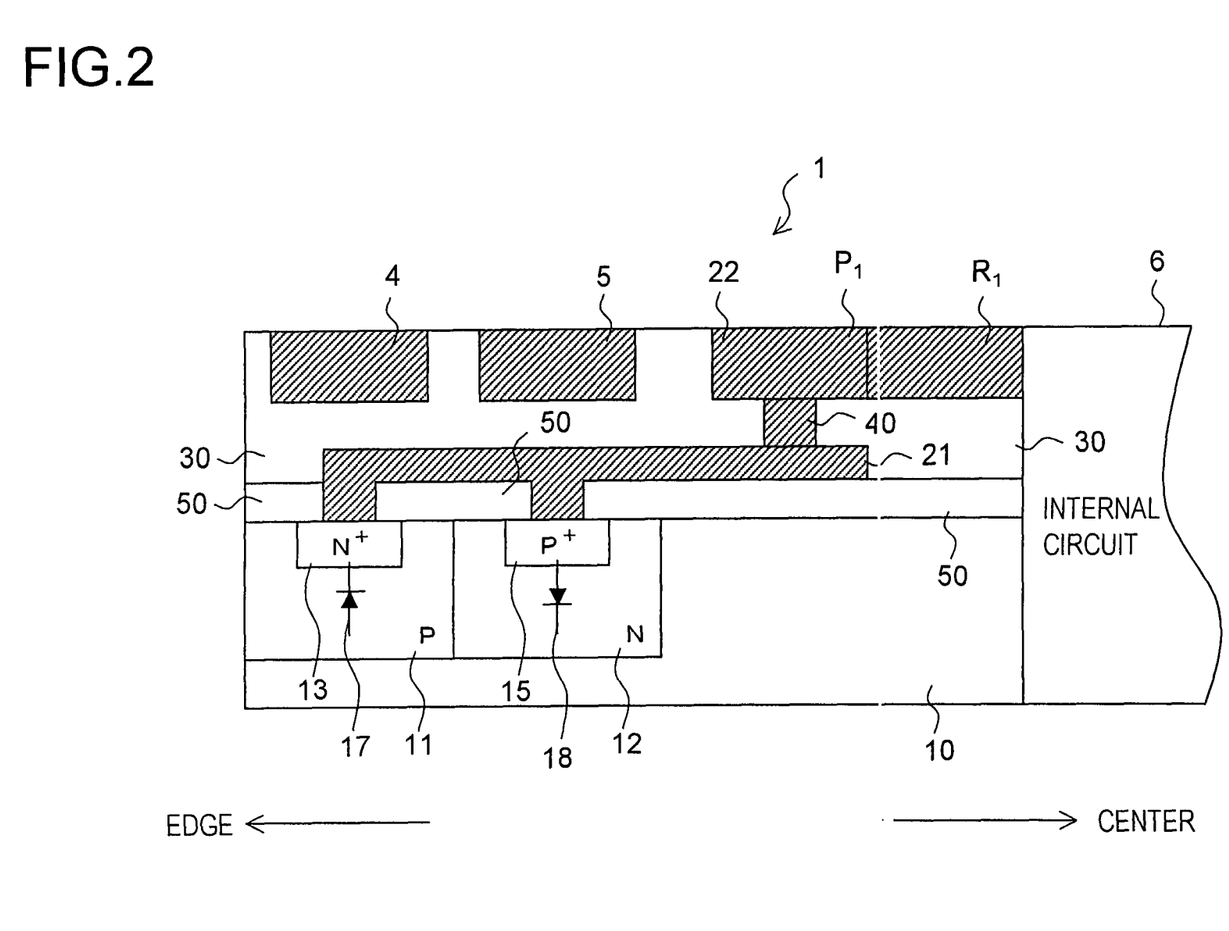
FIG. 2 is a sectional view taken along line B-B shown in FIG. 1.

Now, with reference to FIG. 2, which is a sectional view taken along line B-B shown in FIG. 1, the sectional structure around the input/output pad $P_1$ will be described. In FIG. 2, metal conductive parts are indicated by hatching. Although the following description deals with the structure and other features of, of all the input/output pads $P_1$, $P_2$, . . . , and $P_{14}$, only the input/output pad $P_1$, it should be understood that the description equally applies also to the other input/output pads $P_2$, $P_3$, . . . , and $P_{14}$.

As shown in FIG. 2, the IC chip 1 has a multiple-conductor-layer structure (two-layer structure) including the following two metal conductor layers: a first metal conductor layer ("the first layer") laid as the lower layer; and a second metal conductor layer ("the second layer") laid as the upper layer. These metal conductor layers are formed of aluminum, but may be formed of any material other than aluminum, for example copper or gold.

The input/output pad $P_1$ is composed of a metal film 21 formed in the first layer and a metal film 22 formed in the second layer. The metal films 21 and 22 are electrically connected together at least via a contact hole 40 formed in an insulating film 30 laid between the first and second layers. The signal conductor $R_1$ is connected, at one end, to the metal film 22 and, at the other end, to the internal circuit 6.

Through ion injection and diffusion, in an upper portion of a silicon substrate 10, a P-type well 11 and an N-type well 12 are formed; in an upper portion of the P-type well 11, an N-type diffusion layer 13 is formed; and, in an upper portion of the N-type well 12, a P-type diffusion layer 15 is formed. The PN junction between the N-type diffusion layer 13 and the P-type well 11 forms a protection diode 17, and the PN junction between the P-type diffusion layer 15 and the N-type well 12 forms a protection diode 18. These protection diodes 17 and 18 together form the electrostatic protection device $Q_1$.

On the silicon substrate 10 having the P-type well 11 etc. mentioned above formed therein, an insulating film 50 of silicon oxide is formed, while leaving electrically connected together: the N-type diffusion layer 13 and the metal film 21; the P-type diffusion layer 15 and the metal film 21. The P-type well 11 is electrically connected via an unillustrated part to the negative-side supply conductor 4, and the N-type well 12 is electrically connected via an unillustrated part to the positive-side supply conductor 5.

While the metal film 21 is formed in the first layer, the metal film 22, the signal conductor $R_1$, the negative-side supply conductor 4, and the positive-side supply conductor 5 are all formed in the second layer. The second layer is thicker than the first layer, and thus the following relationship holds: (the sheet resistance of the second layer)<(the sheet resistance of the first layer).

Figure 3:
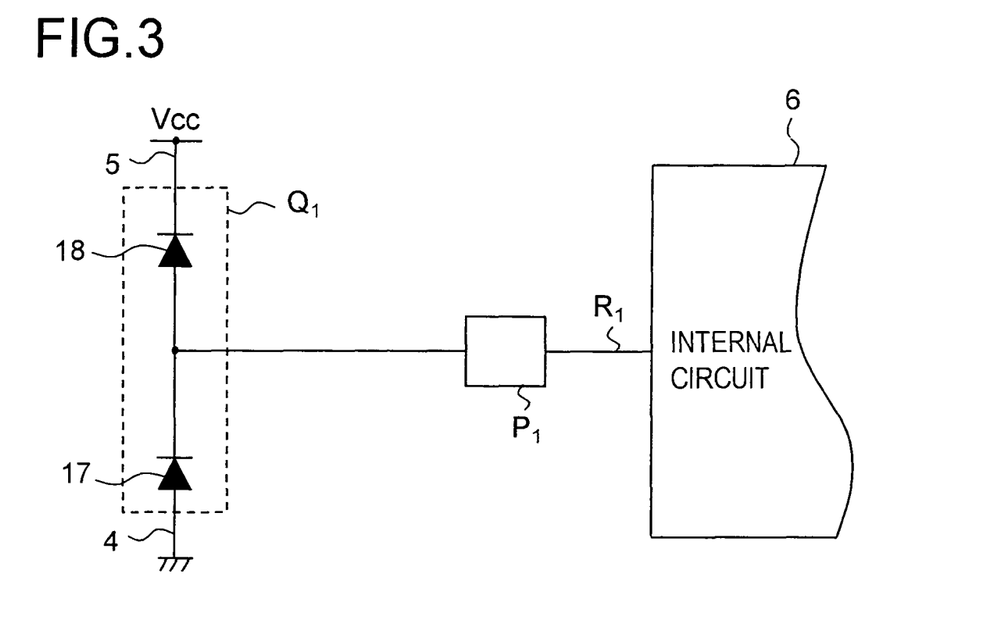
FIG. 3 shows an equivalent circuit of the structure shown in FIG. 2.

FIG. 3 shows an equivalent circuit of the structure shown in FIG. 2. When a positive overvoltage is applied via a bonding wire (unillustrated) to the input/output pad $P_1$, a current flows from the input/output pad $P_1$ via the protection diode 18, the positive-side supply conductor 5, and the positive-side supply pad 3 into the Vcc supply side. On the other hand, when a negative overvoltage is applied via a bonding wire (unillustrated) to the input/output pad $P_1$, a current flows from ground via the negative-side supply pad 2, the negative-side supply conductor 4, and the protection diode 17 to the input/output pad $P_1$. In this way, the overvoltage is prevented from being applied to the internal circuit 6.

As will be understood from the above description, the electrostatic protection device $Q_1$ is arranged closer to the edge than the input/output pad $P_1$ is. Likewise, the electrostatic protection devices $Q_2, Q_3, \ldots$, and $Q_{14}$ are arranged closer to the edge than the input/output pads $P_2, P_3, \ldots$, and $P_{14}$ respectively are. In other words, the electrostatic protection devices (the electrostatic protection device $Q_1$ etc.), the input/output pads (the input/output pad $P_1$ etc.), and the internal circuit 6 are arranged in this order from edge to center of the IC chip 1.

Moreover, the negative-side and positive-side supply conductors 4 and 5 are arranged closer to the edge than the input/output pads (the input/output pad $P_1$ etc.) are, and are formed by using the metal conductor layer of the second layer. The sheet resistance of the second layer is lower than (for example, half as high as) that of the first, i.e., lower, layer. Thus, here, the impedances across the supply conductors (the negative-side and positive-side supply conductors 4 and 5) are smaller than in the conventional example (see FIG. 6 etc.) where the supply conductors 104 and 105 are formed by using the first layer. Thus, the IC chip 1 receives a higher level of protection against electrostatic breakdown than in the conventional example. Moreover, since the electrostatic protection device $Q_1$ is not located between the input/output pad $P_1$ and the internal circuit 6, the length of the signal conductor $R_1$ can be reduced to a minimum. This helps minimize inconveniences such as the delay in the signal conducted across the signal conductor and the distortion of its waveform.

In a case where, in place of or in parallel with the electrostatic protection device $Q_1$, an electrostatic protection device like the electrostatic protection device Qb (see FIG. 8) is built in the IC chip 1, it is easier to arrange the electrostatic protection device Qb in the region where the electrostatic protection device $Q_1$ is located than to arrange it closer to the center than the input/output pad $P_1$ is. The reason is as follows. An active clamper like the electrostatic protection device Qb has a comparatively complicate structure, and thus forming it typically requires the use of two metal conductor layers. When the electrostatic protection device Qb is formed closer to the edge than the input/output pad $P_1$ is as described above, there is no need to give consideration to the arrangement of the signal conductor $R_1$ (that is, the electrostatic protection device Qb can be arranged without consideration given to, among others, how to secure a space to arrange the signal conductor $R_1$ in; consideration needs to be given only to the arrangement of the negative-side and positive-side supply conductors 4 and 5).

Put the other way around, the arrangement of an active clamper like the electrostatic protection device Qb does not restrict the arrangement of the signal conductor $R_1$, and thus there is no need to make a detour or the like as shown in FIG. 9. Thus, it is possible to avoid an increased delay in the conducted signal, increased distortion in its waveform, and a lower degree of integration, all resulting from such a detour or the like.

Also in a case where an active clamper like the electrostatic protection device Qb is built, the negative-side and positive-side supply conductors 4 and 5 are advisably formed by using the second layer.

The IC chip 1 may have a multiple-conductor-layer structure (three-layer structure) including the following three metal conductor layers: a first metal conductor layer ("the first layer") laid as the lowest layer; a second metal conductor layer ("the second layer"); and a third metal conductor layer ("the third layer") laid as the highest layer. In this case, the negative-side and positive-side supply conductors 4 and 5 are advisably formed each by using both the second and third layers. This helps make the impedance per given area of each of the negative-side and positive-side supply conductors 4 and 5 smaller than when they are formed by using the second or third layer alone, and thus helps achieve a still higher protection against electrostatic breakdown.

Figure 4:
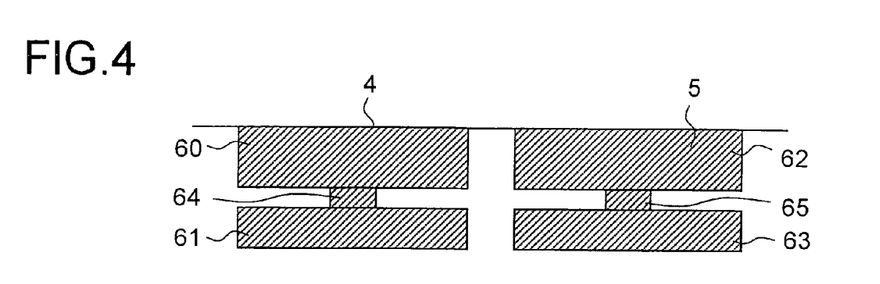
FIG. 4 is a sectional view of a modified example of the structure shown in FIG. 1.

Specifically, for example, as shown in FIG. 4, the negative-side supply conductor 4 is formed with a metal film 60 formed in the third layer and a metal film 61 formed in the second layer, and the positive-side supply conductor 5 is formed with a metal film 62 formed in the third layer and a metal film 63 formed in the second layer. In FIG. 4, metal conductive parts are indicated by hatching. Here, the metal films 60 and 61 are electrically connected together via a contact hole 64, and the metal films 62 and 63 are electrically connected together via a contact hole 65. FIG. 4 is a sectional view showing only a portion where the negative-side and positive-side supply conductors 4 and 5 are laid. Here, the following relationships hold: (the thickness of the third layer)>(the thickness of the second layer)>(the thickness of the first layer); and (the sheet resistance of the third layer)<(the sheet resistance of the second layer)<(the sheet resistance of the first layer).

With a three-layer structure, even when an electrostatic protection device is arranged closer to the center than an input/output pad is as in the conventional example, an active clamper like the electrostatic protection device Qb can be build. In this case, certainly it is possible to connect together the input/output pad Pa and the internal circuit 106 by using the third layer and thus without making a detour as shown in FIG. 9, but it is necessary to form the negative-side and positive-side supply conductors 4 and 5 by using the first layer alone (the third layer cannot be used for this purpose because it is used to form the signal conductor).

By contrast, when an electrostatic protection device (like the electrostatic protection device $Q_1$ or the electrostatic protection device Qb) is arranged closer to the edge than an input/output pad $P_1$ is, and the negative-side and positive-side supply conductors 4 and 5 are arranged closer to the edge than the input/output pad $P_1$ is, then, as describe above, it is easily possible to form the negative-side and positive-side supply conductors 4 and 5 each by using both the second and third layers.

In this embodiment, the electrostatic protection device $Q_1$ etc. is arranged closer to the edge than the input/output pad $P_1$ is, and thus no electrostatic protection device $Q_1$ or the like is provided in the conductor from the input/output pad $P_1$ to the internal circuit 6. This arrangement itself does not lead to a lower level of protection against electrostatic breakdown because, after all, the overvoltage-induced current flowing in or out via the input/output pad $P_1$ is governed by Ohm's law so as to flow through whatever part has a low impedance.

What has been described above can be modified in many ways. For example, although the description given thus far deals with an IC chip having a two- or three-layer structure, the present invention finds wide application in IC chips having a multiple-conductor-layer structure including n (where n is an integer equal to or greater than 2) metal conductor layers. Also with four or more layers, the further up (the farther from the silicon substrate 10) a metal conductor layer is located, the thicker it is formed so that the following relationship holds: (the sheet resistance of the nth layer)<(the sheet resistance of the (n−1)th layer)< . . . <(the sheet resistance of the second layer)<(the sheet resistance of the first layer).

The supply conductors (the negative-side and positive-side supply conductors 4 and 5) may be formed by using the metal conductor layer with the lowest sheet resistance (specifically, the n-th, i.e., uppermost, layer), or may be formed so as to include that metal conductor layer with the lowest sheet resistance. Alternatively, the supply conductors may be formed by using, of all the metal conductor layers, any other than the one in the first, i.e., lowermost, layer (specifically, the second, third, . . . , or nth layer). Alternatively, the supply conductors may be formed by using m layers (where m is an integer equal to or greater than 2 and fulfilling n≥m) selected from, for example, the metal conductor layers excluding those in the nth and lowermost layers.

In the embodiment described above, the negative-side and positive-side supply conductors 4 and 5 may be arranged in a reversed layout (for example, in FIG. 1, the positive-side supply conductor may be arranged closer to the edge than the negative-side supply conductor is). Although the embodiment described above deals with a case involving one pair of negative-side and positive-side supply conductors, the present invention is applicable to multiple-supply, multiple-ground semiconductor devices involving two or more such pairs.

The electrostatic protection devices $Q_1$, $Q_2$, . . . , and $Q_{14}$ and Qb (see FIGS. 3 and 8) specifically described as being provided in the IC chip 1 are merely examples of electrostatic protection devices to which the present invention is applicable; that is, the present invention is applicable to any other electrostatic protection devices.

In the example shown in FIG. 1, the negative-side and positive-side supply conductors 4 and 5 are bent substantially at right angles in the four corners of the IC chip 1, which is square in shape. That is, in the four corners, the center lines of the negative-side and positive-side supply conductors 4 and 5 are bent at approximately 90 degrees. Bending supply conductors at such a sharp angle may adversely affect the impedances across them.

Figure 10:
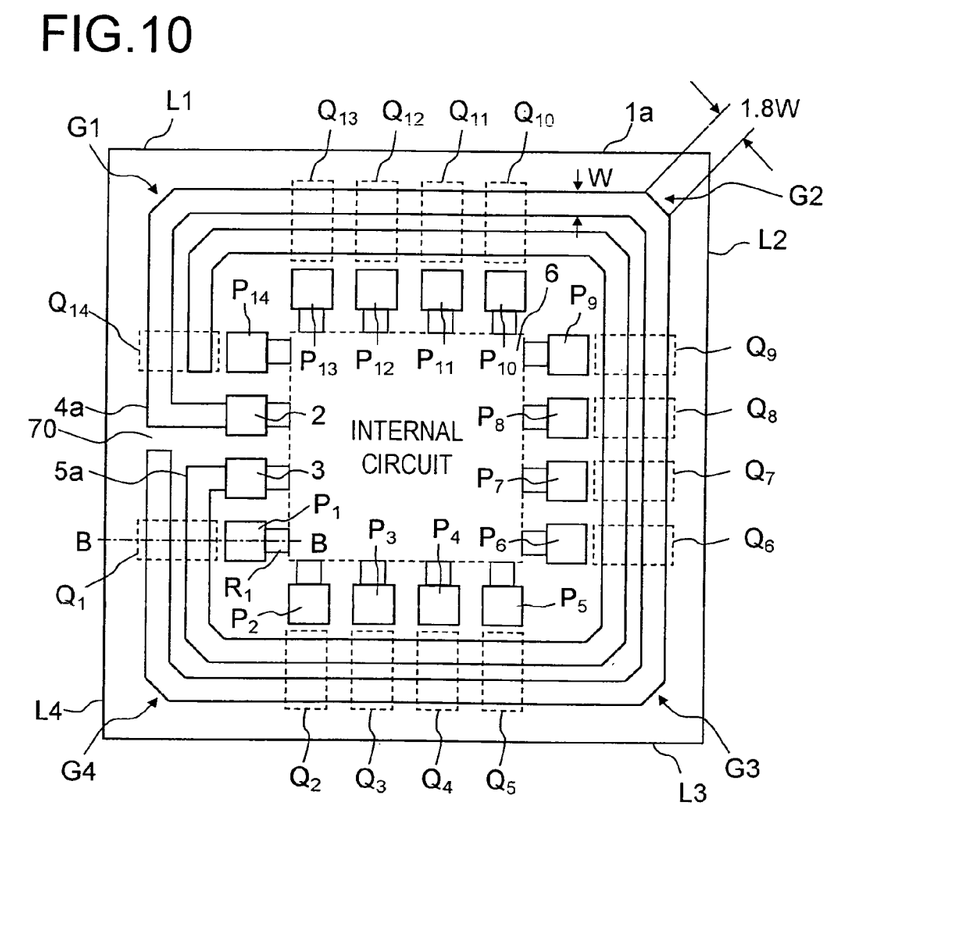
FIG. 10 is an overall plan view showing a modified example of the IC chip shown in FIG. 1.

For this reason, for the purpose of reducing the impedances across the supply conductors, corner parts of the supply conductors may be cut off. FIG. 10 shows, as a modified example of the IC chip 1 shown in FIG. 1, an IC chip 1a in which corner parts of supply conductors are cut off. In FIG. 10, such parts as are found also in FIG. 1 are identified with common reference numerals and symbols, and no overlapping explanations will be repeated. The IC chip 1a shown in FIG. 10 differs from the IC chip 1 shown in FIG. 1 in that the supply conductors 4 and 5 shown in FIG. 1 are replaced with supply conductors 4a and 5a, respectively; in all the other respects, the two IC chips are identical.

Like the IC chip 1 shown in FIG. 1, the IC chip 1a is substantially square in shape. In all the four corners G1, G2, G3, and G4 of its square shape, however, the corner parts of the supply conductors 4a and 5a are cut off.

The negative-side supply conductor 4a is electrically connected to the negative-side supply pad 2, and is arranged so as to surround the input/output pads $P_1$, $P_2$, . . . , and $P_{14}$ and the internal circuit 6. Except that the supply conductor 4a has its corner parts cut off in the corners G1 to G4, it is identical with the negative-side supply conductor 4 shown in FIG. 1. The positive-side supply conductor 5a is electrically connected to the positive-side supply pad 3, and is arranged so as to surround the input/output pads $P_1$, $P_2$, . . . , and $P_{14}$ and the internal circuit 6. Except that the supply conductor 5a has its corner parts cut off in the corners G1 to G4, it is identical with the positive-side supply conductor 5 shown in FIG. 1.

In the corners G1 to G4, the center line (unillustrated) of the supply conductor 4a is bent at angles smaller than 90 degrees. For example, in each corner, the supply conductor 4a (i.e., the center line thereof) is bent at 45 degrees twice in the same direction so that eventually the direction of the current is turned at 90 degrees. Likewise, in the corners G1 to G4, the center line (unillustrated) of the supply conductor 5a is bent at angles smaller than 90 degrees. For example, in each corner, the supply conductor 5a (i.e., the center line thereof) is bent at 45 degrees twice in the same direction so that eventually the direction of the current is turned at 90 degrees.

It is preferable that, assuming that the width of the supply conductor 4a is W, the cuts in the corners G1 to G4 be given a width in the range from 1.5 W to 2.0 W (further preferably, 1.8 W) as shown in FIG. 10. The same applies to the supply conductor 5a. As a variation of the shape shown in FIG. 10, the supply conductors 4a and 5a may be so formed that their center lines describe arcs in the corners G1 and G4.

Figure 11:
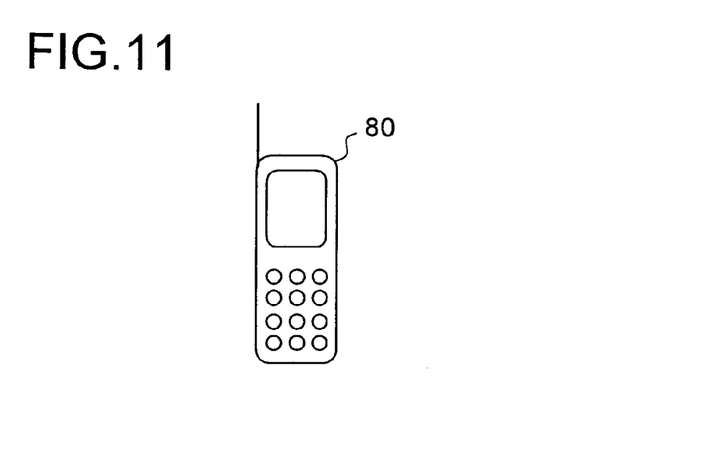
FIG. 11 is a perspective view of a cellular phone incorporating the IC ship shown in FIG. 1 or 10.

The present invention is suitable for application in semiconductor devices such as IC chips as exemplified by gate arrays. The present invention is suitable for application in ICs that handle comparatively high currents, such as power supply ICs and ICs (motor drivers) that control the driving of a motor, and in electric appliances employing such ICs. Semiconductor devices according to the present invention are suitable for use in various electric appliances, for example mobile communication equipment such as cellular phones and microcellular phones (as used in the Personal Handyphone System, abbreviated to PHS, in Japan) and information processing equipment as exemplified by personal computer. The operation of such electric appliances can be controlled with semiconductor devices according to the present invention. FIG. 11 is a perspective view of a cellular phone 80 as an example of an electric appliance incorporating the IC chip 1 or 1a. The cellular phone 80 incorporates a processor or the like (unillustrated) built with the IC chip 1 or 1a, and the processor controls the various functions of the cellular phone 80.

What is claimed is:
1. A semiconductor device comprising:
a positive-side supply pad to which a positive-side supply voltage is fed;
a negative-side supply pad to which a negative-side supply voltage is fed;
a positive-side supply conductor that is electrically connected to the positive-side supply pad;
a negative-side supply conductor that is electrically connected to the negative-side supply pad;
an input/output pad via which a signal can be fed in from outside the semiconductor device or fed to outside the semiconductor device;
a first electrostatic protection device that is electrically connected to the input/output pad;
a second electrostatic protection device that is electrically connected in parallel with the first electrostatic protection device; and
an internal circuit that is electrically connected via a signal conductor to the input/output pad, wherein the first electrostatic protection device, the input/output pad, and the internal circuit are arranged in this order from an area adjacent an edge of the semiconductor device toward a center of the semiconductor device, wherein the second electrostatic protection device, the input/output pad, and the internal circuit are arranged in this order from an area adjacent an edge of the semiconductor device toward a center of the semiconductor device, wherein each of the positive-side supply conductor and the negative-side supply conductor has a center line describing an arc in an area at a corner of the semiconductor device, wherein the first electrostatic protection device comprises:
  a first diode of which a cathode receives the positive-side supply voltage, and of which an anode is electrically connected to the input/output pad; and
  a second diode of which a cathode is electrically connected to the input/output pad, and of which an anode receives the negative-side supply voltage, and wherein the second electrostatic protection device comprises:
  a P-channel MOS transistor of which a gate and a source receive the positive-side supply voltage, and of which a drain is electrically connected to the input/output pad; and
  an N-channel MOS transistor of which a drain is electrically connected to the input/output pad, and of which a gate and a source receive the negative-side supply voltage.

2. The semiconductor device of claim 1 wherein the positive-side supply conductor and the negative-side supply conductor are arranged nearer to the edge than the input/output pad is.

3. The semiconductor device of claim 2 wherein the semiconductor device has a multiple-conductor-layer structure including n (where n is an integer greater than or equal to 2) metal conductor layers, and the positive-side supply conductor and the negative-side supply conductor are formed by using, of the n metal conductor layers, at least one having a smallest sheet resistance.

4. The semiconductor device of claim 2 wherein the semiconductor device has a multiple-conductor-layer structure including n (where n is an integer greater than or equal to 2) metal conductor layers, and the positive-side supply conductor and the negative-side supply conductor are formed by using, of the n metal conductor layers, any other than a lowermost one.

5. The semiconductor device of claim 2 wherein the semiconductor device has a multiple-conductor-layer structure including n (where n is an integer greater than or equal to 2) metal conductor layers, and the positive-side supply conductor and the negative-side supply conductor are formed by using more than one of the n metal conductor layers.

6. An electric appliance comprising a semiconductor device, wherein the semiconductor device comprises:
  a positive-side supply pad to which a positive-side supply voltage is fed;
  a negative-side supply pad to which a negative-side supply voltage is fed;
  a positive-side supply conductor that is electrically connected to the positive-side supply pad;
  a negative-side supply conductor that is electrically connected to the negative-side supply pad;
  an input/output pad via which a signal can be fed in from outside the semiconductor device or fed to outside the semiconductor device;
  a first electrostatic protection device that is electrically connected to the input/output pad;
  a second electrostatic protection device that is electrically connected in parallel with the first electrostatic protection device; and
  an internal circuit that is electrically connected via a signal conductor to the input/output pad, wherein the first electrostatic protection device, the input/output pad, and the internal circuit are arranged in this order from an area adjacent an edge of the semiconductor device toward a center of the semiconductor device, wherein the second electrostatic protection device, the input/output pad, and the internal circuit are arranged in this order from an area adjacent an edge of the semiconductor device toward a center of the semiconductor device, wherein each of the positive-side supply conductor and the negative-side supply conductor has a center line describing an arc in an area at a corner of the semiconductor device, wherein the first electrostatic protection device comprises:
  a first diode of which a cathode receives the positive-side supply voltage, and of which an anode is electrically connected to the input/output pad; and
  a second diode of which a cathode is electrically connected to the input/output pad, and of which an anode receives the negative-side supply voltage, and wherein the second electrostatic protection device comprises:
  a P-channel MOS transistor of which a gate and a source receive the positive-side supply voltage, and of which a drain is electrically connected to the input/output pad; and
  an N-channel MOS transistor of which a drain is electrically connected to the input/output pad, and of which a gate and a source receive the negative-side supply voltage.

* * * * *